PIEZOELECTRIC CERAMICS

Filed Oct. 16, 1968 2 Sheets-Sheet 1

INVENTORS
NORIO TSUBOUCHI
MASAO TAKAHASHI
TOMEJI OHNO
TSUNEO AKASHI
BY
Hopgood & Calimafde
ATTORNEYS Dec. 1, 1970 NORIO TSUBOUCHI ET AL 3,544,470

PIEZOELECTRIC CERAMICS

Filed Oct. 16, 1968 2 Sheets-Sheet 2

INVENTORS
NORIO TSUBOUCHI
MASAO TAKAHASHI
TOMEJI OHNO
TSUNEO AKASHI

BY Hopgood & Calimafde
ATTORNEYS

1

3,544,470
PIEZOELECTRIC CERAMICS
Norio Tsubouchi, Masao Takahashi, Tomeji Ohno, and Tsuneo Akashi, Tokyo, Japan, assignors to Nippon Electric Company, Limited, Tokyo-to, Japan
Filed Oct. 16, 1968, Ser. No. 768,143
Int. Cl. C04b *35/46, 35/48*
U.S. Cl. 252—62.9 2 Claims

ABSTRACT OF THE DISCLOSURE

A piezoelectric ceramic is disclosed consisting essentially of a solid solution of the three components $$Pb(Mn_{2/3}W_{1/3})O_3$$

$PbTiO_3$ and $PbZrO_3$.

This invention relates to piezoelectric materials and more particularly to novel piezoelectric ceramics having excellent piezoelectric properties.

Fundamental measures for evaluating in practice the piezoelectric properties of a piezoelectric material are the electromechanical coupling factor and the mechanical quality factor. The former is a representative of the efficiency of transforming the electric oscillation into mechanical vibration and of conversely transforming the mechanical vibration into electrical oscillation. Greater electromechanical coupling factor stands for better efficiency of interconversion. The latter shows the reciprocal proportion of the energy consumed by the material during the energy conversion, larger mechanical quality factor accounting for smaller energy consumption.

One of the typical fields of application of piezoelectric materials is manufacture of the elements of ceramic filters. In this case, it is necessary to furnish the electromechanical coupling factor with an optimum value selected from a wide range between an extremely great value and a very small value and it is desirable for the mechanical quality factor to assume as large a value as possible. This fact is fully described in, for example, R. C. V. Macario, "Design Data for Band-Pass Ladder Filter Employing Ceramic Resonators," which appears in Electronic Engineering, vol. 33, No. 3 (1961), pp. 171–177.

The transducer elements of mechanical filters provide another important field of application of piezoelectric ceramics. In this case, both the electromechanical coupling factor and the mechanical quality factor should be as large as possible.

It is known that conventional piezoelectric ceramics, for example, barium titanate ($BaTiO_3$) and lead titanate zirconate [$Pb(Ti{\cdot}Zr)O_3$] tend to exhibit low values in either or both of the electromechanical coupling and mechanical quality factors which militate against their use in practice. In particular, the mechanical quality factor has often been so small as to make the practical use of the ceramics practically impossible. Attempts have been made to improve these factors by incorporating various other additives into the ceramics, such as lead titanate zirconate ceramics, but, in most cases, the improvements, if any, have been limited to only one of the electromechanical coupling factor and the mechanical quality factor. Thus, as far as we are aware, these two factors have not been improved simultaneously.

The object of this invention is to provide novel piezoelectric ceramics having large values for both the electromechanical coupling factor and mechanical quality factor.

The other object of this invention is to provide novel piezoelectric ceramics suited for use in various fields such as manufacture of the elements of ceramic filters and the transducer elements of mechanical filters.

2

This invention is based on the discovery that the ceramic compositions consisting essentially of a solid solution of $Pb(Mn_{2/3}W_{1/3})O_3$—$PbTiO_3$—$PbZrO_3$ ternary system provide excellent piezoelectric properties and are particularly useful.

The ceramic compositions provided by the invention contain lead (Pb) as a divalent metallic element and also titanium (Ti) and zirconium (Zr) as tetravalent metallic elements. Moreover, manganese (Mn) and tungsten (W) are contained in such a proportion that they may be, as a whole, substantially equivalent to a tetravalent metallic element. Up to 25 atom percent of lead (Pb) contained in the compositions may be replaced by at least one element of the group consisting of barium (Ba), strontium (Sr) and calcium (Ca.).

With regard to ceramics of the ternary system $$Pb(Mn_{2/3}W_{1/3})O_3—PbTiO_3—PbZrO_3$$

are represented by the formula $$[Pb(Mn_{2/3}W_{1/3})O_3]x[PbTiO_3]y[PbZrO_3]z$$

where $x$, $y$ or $z$ is the molecular ratio of each component and $x+y+z=1.00$, it has been found that ceramic compositions possessing markedly improved piezoelectric properties are obtainable within the range determined by the following combinations of the molecular ratios $x$, $y$ and $z$:

| x | y | z |
|---|---|---|
| 0.01 | 0.59 | 0.40 |
| 0.01 | 0.09 | 0.90 |
| 0.05 | 0.05 | 0.90 |
| 0.20 | 0.20 | 0.60 |
| 0.20 | 0.40 | 0.40 |

Among the known conventional piezoelectric ceramic compositions are those covered by the ternary system $$Pb(Mg_{1/3}Nb_{2/3})O_3—PbTiO_3—PbZrO_3$$

disclosed in the U.S. Pat. 3,268,453, granted Aug. 23, 1966, to H. Ouchi et al. However, conventional ceramic material of the foregoing type does not improve by itself the piezoelectric properties of previously known $$PbTiO_3—PbZrO_3$$

ceramics, and an improved piezoelectric ceramic material is obtained only by adding thereto at least one of the oxides of manganese, cobalt, nickel, iron and chromium as additional constituents up to 3 weight percent. In contrast, the $Pb(Mn_{2/3}W_{1/3})O_3$—$PbTiO_3$—$PbZrO_3$ ternary system of this invention remarkably improves the piezoelectric properties without any additional constituent. This difference in improvement of piezoelectric properties between the conventional compositions and the novel compositions of this invention is believed to be due to the fact that the conventional compositions use in the basic composition magnesium (Mg), an element belonging to the Group II–A in the Periodic Table, in conjunction with a Group V–B element niobium (Nb), while, in the compositions of this invention, a Group VI–B element tungsten (W) is used in conjunction with a Group VII–B element manganese (Mn).

Excellent piezoelectric properties of the ceramic compositions of this invention will be apparent from the following more particular description of preferred examples of this invention, as illustrated in the accompanying drawings, wherein.

EXAMPLES

Powdered materials of lead monoxide (PbO), manganese carbonate ($MnCO_3$), tungsten trioxide ($WO_3$), titanium dioxide, ($TiO_2$), and zirconium dioxide ($ZrO_2$) were employed as starting materials in formulating the $Pb(Mn_{2/3}W_{1/3})O_3$—$PbTiO_3$—$PbZrO_3$ ceramics provided by the invention. These powdered materials were proportioned to provide final specimens having the compositions shown hereinafter in Table 1.

The manganese carbonate ($MnCO_3$) was calculated on the basis of manganese sesquioxide ($Mn_2O_3$). In addition, lead monoxide, titanium dioxide and zirconium dioxide were proportioned to obtain the conventional lead titanate zirconate ceramics having the compositions shown in Table 2.

The powders were mixed in a ball mill with distilled water. The mixed powder was subjected to filtration, dried, crushed, then presintered at 900° C. for one hour, and again crushed. Thereafter, the mixture, with a small amount of distilled water added to it, was press-molded into discs of 20 mm. in diameter at a pressure of 700 kg./cm.$^2$ and sintered in an atmosphere of lead monoxide (PbO) for one hour at a temperature of 1300° C. for the specimens containing no $Pb(Mn_{2/3}W_{1/3})O_3$, at 1260° C. for those containing a molecular ratio of more than 0.10 of the same component. The resulting ceramic discs were polished on both surfaces to the thickness of one millimeter, provided with silver electrodes on both surfaces, and thereafter piezoelectrically activated through the polarization treatment at 100° C. for one hour under an applied D.C. electric field of 40 kv./cm. for the specimens containing a molecular ratio up to about 0.10 of $Pb(Mn_{2/3}W_{1/3})O_3$ or of 30 kv./cm. for those containing more than 0.10 of the same component.

After the ceramic discs have been allowed to stand for 24 hours, the electromechanical coupling factor for the radial mode vibration ($k_r$) and the mechanical quality factor ($Qm$) were measured to evaluate the piezoelectric activities. The measurement of these piezoelectric properties was made according to the IRE standard circuit. The value of $k_r$ was calculated by the resonant to antiresonant frequency method. The dielectric constant ($\epsilon$) and the dielectric loss (tan $\delta$) were also measured at a frequency of 1 kHz.

Tables 1 and 2 show typical results obtained. In the tables, the specimens are arranged according to the $PbTiO_3$ content thereof and there are also listed several values of Curie temperature which was determined through measurement of temperature variation in the dielectric constant ($\epsilon$). The novel compositions of the specimens of Table 1 are shown with black points in FIG. 1, while the conventional compositions of the specimens of Table 2 are indicated by crosses in the same figure.

Figure 2A:
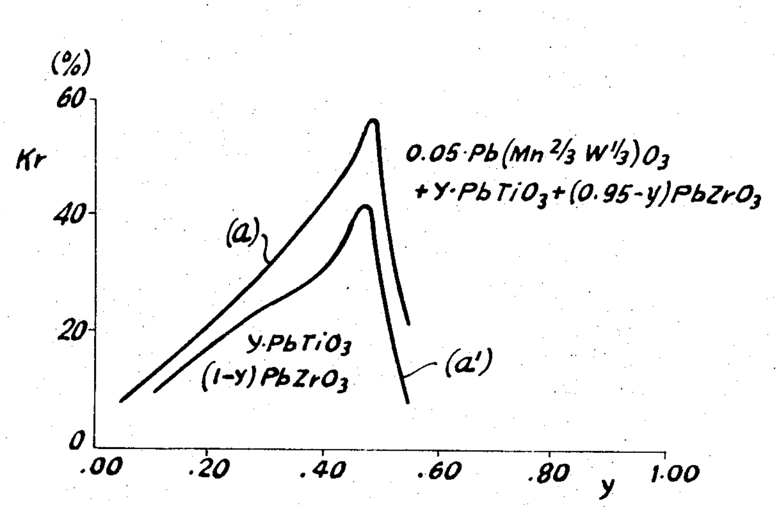
FIGS. 2A and 2B are graphs showing the electromechanical coupling factor $a'$, $a$ and the mechanical quality factor $b'$, $b$ of both the conventional lead titanate zirconate ceramics and the ceramics of this invention, respectively, as a function of change in the lead titanate content in both the ceramics.
Figure 2B:
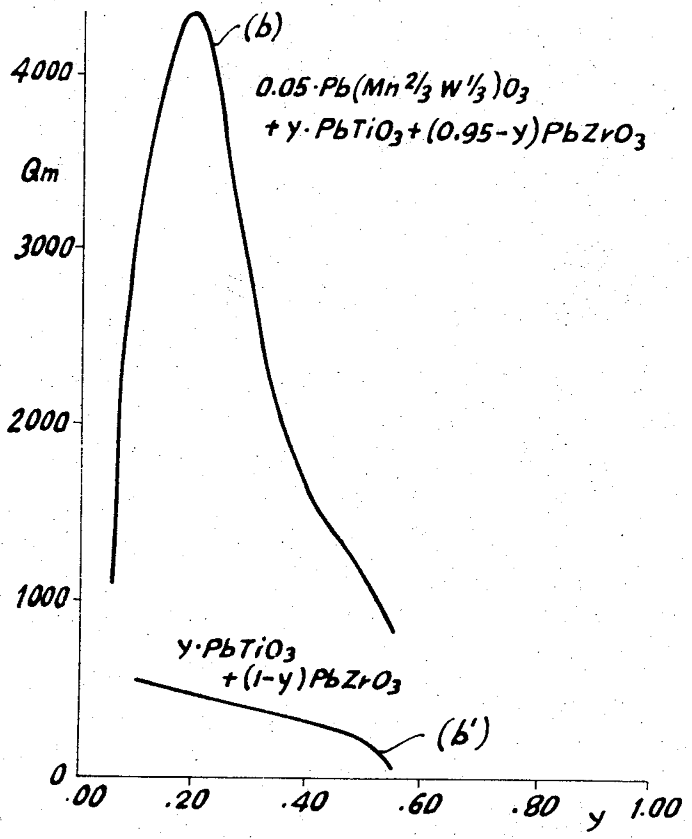

The results for the specimens Nos. 5 and 6 of Table 1 show that the ceramics of this invention have extremely large values of both $k_r$ and $Qm$. In the specimens Nos. 13 and 16 of Table 1, increase in the $Qm$ value is particularly remarked. Comparison of these results with those for the specimens Nos. 4 and 9 of Table 2 will reveal that the greatest $k_r$ and $Qm$ values of the novel ceramics of this invention are far superior to the maximum $k_r$ and $Qm$ values of the conventional lead titanate zirconate ceramics which have been known as the most excellent piezoelectric ceramic material. Moreover, comparison of the results in Table 1 with those in Table 2, particularly between the novel and conventional ceramics in which the ratios of the $PbTiO_3$ content and the $PbZrO_3$ content are similar to each other will also indicate that both $k_r$ and $Qm$ are remarkedly improved in the ceramics of this invention. This latter fact will be more clearly understood from FIGS. 2, 2A and 2B, wherein one curve in each represents the $k_r$ value ($a$) and the $Qm$ value ($b$) of the novel ceramics containing a mole ratio of 0.05 of $Pb(Mn_{2/3}W_{1/3})O_3$, the varying amount $v$ of $PbTiO_3$ and the remaining amount of $PbZrO_3$, while the curves $a'$, $b'$ show the $k_r$ value and the $Qm$ value of the conventional lead titanate zirconate ceramics with the varying amount $v$ of $PbTiO_3$.

As is seen from the above, this invention provides markedly improved and useful piezoelectric ceramics having large value of both $k_r$ and $Qm$.

Figure 1:
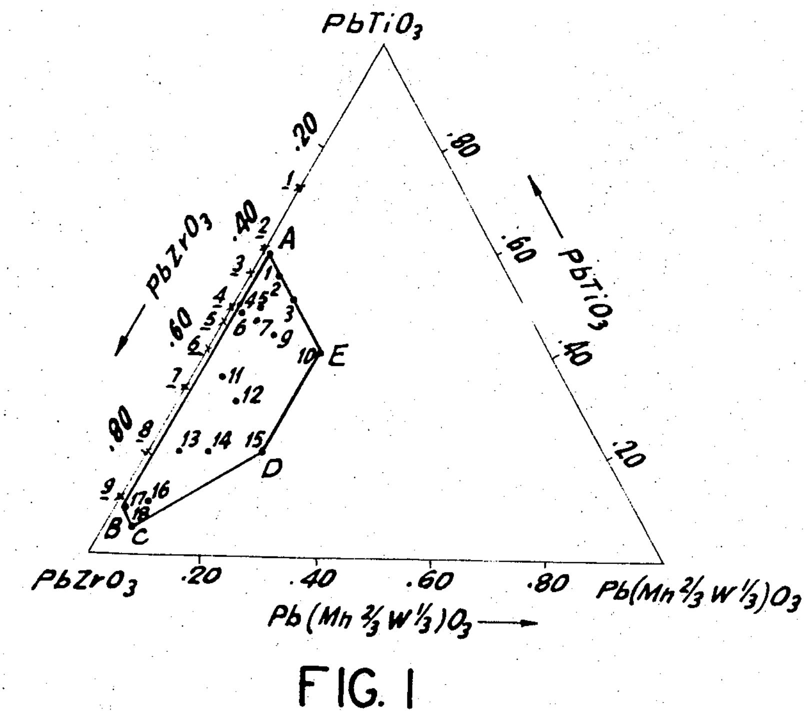
FIG. 1 is a ternary diagram depicting both the effective ranges of the compositions of this invention and the specific compositions as exemplified in the examples.

In the novel ceramics of the ternary system $$Pb(Mn_{2/3}W_{1/3})O—PbTiO_3—PbZrO_3$$

of this invention, the aforementioned superior piezoelectric properties are possessed by the compositions represented by the formula.

$$[Pb(Mn_{2/3}W_{1/3})O_3]x[PbTiO_3]y[PbZrO_3]z$$

where $x$, $y$ and $z$ represent a set of molecular ratios and $x+y+z=1.00$, and lying within the area A–B–C–D–E of FIG. 1 of the drawings. The sets of molecular ratios of the vertices of this area are as follows:

| | x | y | z |
|---|---|---|---|
| A | 0.01 | 0.59 | 0.40 |
| B | 0.01 | 0.09 | 0.90 |
| C | 0.05 | 0.05 | 0.90 |
| D | 0.20 | 0.20 | 0.60 |
| E | 0.20 | 0.40 | 0.40 |

Where the $Pb(Mn_{2/3}W_{1/3})O_3$ content of the ternary system ceramic is less than that lying within the above-mentioned area, the piezoelectric properties of the ceramics obtained are inferior to or nearly equal to those of the conventional lead titanate zirconate ceramics. If the $Pb(Mn_{2/3}W_{1/3})O_3$ content is more than that lying within the above-mentioned area, it is difficult to sinter the composition and the sintered products do not provide practicable piezoelectric properties. Where the $PbTiO_3$ content is outside the above-mentioned area, the piezoelectric properties of the ceramics tend to deteriorate to such an extent as to render the product practically useless. Finally, where the $PbZrO_3$ content is less than the effective content lying within the above-mentioned area, generally it is difficult to complete the sintering and carry out the polarization treatment, such that a useful piezoelectric ceramic material is practically unattainable. With $PbZrO_3$ contents of more than the desirable effective amount, usually a non-useful piezoelectric ceramic material is obtained having markedly inferior piezoelectric properties.

It has been determined that the ceramics provided by the invention are particularly useful when the compositions fall within the area specified above. These ceramics show excellent piezoelectric properties and have a high Curie temperature as shown in Table 1 and, moreover, the piezoelectric activities prevail up to elevated temperature.

Figure 3:
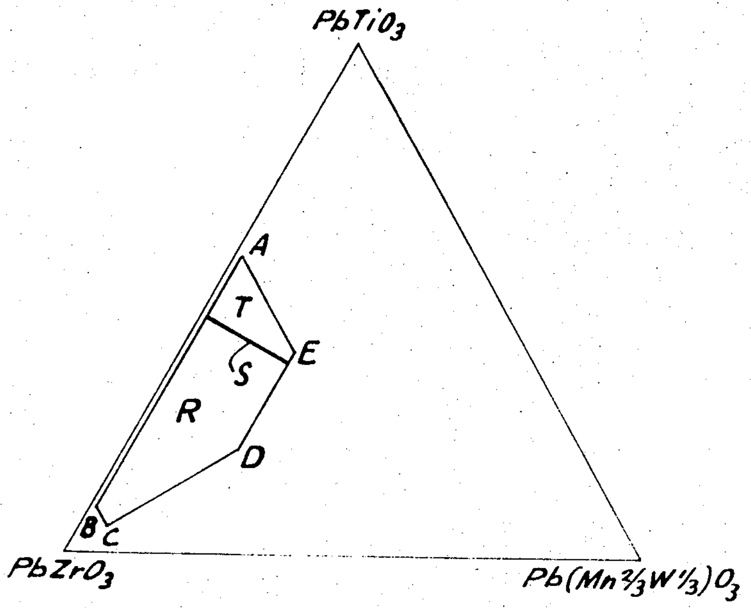
FIG. 3 is a phase diagram of the ternary system of this invention.

The ternary system ($Pb(Mn_{2/3}W_{1/3})O_3$, $PbTiO_3$, and $PbZrO_3$ of this invention comprises a solid solution which exists in substantially most of the compositions, the solid solution having a perovskite-type crystalline structure. FIG. 3 shows the crystalline phases of the ceramic compositions lying within the area A–B–C–D–E of FIG. 1 as determined at room temperature by the powder method of X-ray analysis. These compositions have a perovskite-type crystalline structure and belong to either the tetragonal phase (indicated by T in the figures) or the rhombohedral phase (indicated by R). The morphotropic phase boundary is shown by line S in the figure. In general, $k_r$ is extremely great in the vicinity of this phase boundary, while $Qm$ is extremely large in the rhombohedral phase.

It will be apparent that the starting materials to be used in the manufacture of the ceramics of this invention are not limited to those mentioned in the above examples. Generally speaking, those oxides which are easily decomposed at elevated temperature to form required compositions may be used, such as $Pb_3O_4$ for PbO, $MnO_2$ for $MnCO_3$ and the like. Also, salts such as oxalates or carbonates may be used instead of the oxides used in the examples, which are easily decomposed into the respective oxides at elevated temperature. Even hydroxides of the same character as above may be used instead of the oxides. Moreover, excellent piezoelectric ceramic materials having similar properties to the above examples may be obtained by preparing separately the powdered material of each of the constituents $Pb(Mn_{2/3}W_{1/3})O_3$, $PbTio_3$ and $PbZrO_3$ in advance and by then using them as starting materials to be mixed subsequently.

Example No. 8 of Table 1 reveals that excellent piezoelectric properties are still obtained by the compositions, even when a part of the lead is replaced by strontium. In general, the piezoelectric properties of the compositions of the type containing lead titanate or lead zirconate is not lost, even when up to about 25 atom percent of lead contained in the compositions is replaced by at least one of the elements from the group consisting of barium, strontium and calcium.

It is known that zirconium dioxide ($ZrO_2$) available in the market usually contains several percent of hafnium dioxide ($HfO_2$). Accordingly, the ceramic compositions of this invention may contain small amounts of such oxides or elements as exist in the materials available in the market without substantially adversely affecting the properties. Moreover, it is understood that additions of small amounts of other constituents to the ceramic compositions of this invention may further improve the piezoelectric properties, as is recognized similarly for conventional lead titanate zirconate ceramics.

TABLE 1

| No. | Mol ratio of composition: $Pb(Mn_{2/3}W_{1/3})O_3$ $x$ | $PbTiO_3$ $y$ | $PbZrO_3$ $z$ | $k_r$, percent | $Qm$ | $\epsilon$ | tan $\delta$ percent | Curie temp., °C. |
|---|---|---|---|---|---|---|---|---|
| 1 | 0.01 | 0.59 | 0.40 | 5 | 1,440 | 360 | 1.2 | -------- |
| 2 | 0.05 | 0.55 | 0.40 | 22 | 840 | 480 | 1.8 | -------- |
| 3 | 0.10 | 0.50 | 0.40 | 28 | 160 | 820 | 6.0 | -------- |
| 4 | 0.01 | 0.48 | 0.51 | 43 | 580 | 1,080 | 1.2 | -------- |
| 5 | 0.05 | 0.48 | 0.47 | 57 | 1,250 | 1,260 | 1.9 | -------- |
| 6 | 0.02 | 0.47 | 0.51 | 56 | 1,080 | 710 | 1.3 | 380 |
| 7 | 0.05 | 0.455 | 0.495 | 50 | 1,370 | 460 | 1.5 | -------- |
| 8*** | 0.05 | 0.455 | 0.495 | 48 | 1,440 | 420 | 1.6 | -------- |
| 9 | 0.10 | 0.43 | 0.47 | 36 | 530 | 570 | 7.5 | 330 |
| 10 | 0.20 | 0.40 | 0.40 | 11 | 80 | 490 | 8.8 | -------- |
| 11* | 0.05 | 0.35 | 0.60 | 37 | 2,130 | 430 | 2.4 | -------- |
| 12* | 0.10 | 0.30 | 0.60 | 23 | 1,200 | 320 | 2.8 | -------- |
| 13 | 0.05 | 0.20 | 0.75 | 19 | 4,350 | 240 | 2.8 | -------- |
| 14 | 0.10 | 0.20 | 0.70 | 16 | 2,110 | 280 | 2.5 | -------- |
| 15 | 0.20 | 0.20 | 0.60 | 4 | 130 | 310 | 9.2 | -------- |
| 16** | 0.05 | 0.10 | 0.85 | 12 | 3,180 | 190 | 2.3 | -------- |
| 17 | 0.01 | 0.09 | 0.90 | 10 | 1,770 | 160 | 1.9 | -------- |
| 18 | 0.05 | 0.05 | 0.90 | 8 | 1,060 | 180 | 2.2 | -------- |

NOTE:
In the manufacture of the specimens indicated with an asterisk (*), triplumbic tetroxide ($Pb_3O_4$) was used instead of lead monoxide (PbO) as one of the starting materials.
In the manufacture of the specimen indicated with a double asterisk (**), manganese oxide ($MnO_2$) as calculated on the basis of manganese sesquioxide ($Mn_2O_3$) was used instead of manganese carbonate ($MnCO_3$).
In the specimen with triple asterisks (***), strontium (Sr) was substituted for 5 atom % of lead (Pb), wherein strontium carbonate ($SrCO_3$) was additionally used as one of the starting materials.

TABLE 2

| No. | Mol ratio of composition: $PbTiO_3$ | $PbZrO_3$ | $K_r$, percent | $Qm$ | $\epsilon$ | tan $\delta$, percent |
|---|---|---|---|---|---|---|
| 1 | 0.70 | 0.30 | -------- | -------- | 340 | 5.7 |
| 2 | 0.60 | 0.40 | -------- | -------- | 300 | 2.4 |
| 3 | 0.55 | 0.45 | 8 | 30 | 350 | 1.3 |
| 4 | 0.48 | 0.52 | 42 | 250 | 1,060 | 1.6 |
| 5 | 0.45 | 0.55 | 38 | 290 | 640 | 3.0 |
| 6 | 0.40 | 0.60 | 30 | 320 | 460 | 3.1 |
| 7 | 0.30 | 0.70 | 24 | 380 | 380 | 3.3 |
| 8 | 0.20 | 0.80 | 15 | 470 | 350 | 3.3 |
| 9 | 0.10 | 0.90 | 10 | 580 | 280 | 3.4 |

NOTE:
For the specimens Nos. 1 and 2, the evaluation of piezoelectric activities could not be obtained.

Although the present invention has been described in conjunction with preferred embodiments, it is to be understood that modifications and variations may be resorted to without departing from the spirit and scope of the invention as those skilled in the art will readily understand. Such modifications and variations are considered to be within the purview and scope of the invention and the appended claims.

What is claimed is:

1. A piezoelectric ceramic consisting essentially of the composition represented by the formula:

$$[Pb(Mn_{2/3}W_{1/3})O_3]x[PbTiO_3]y[PbZrO_3]z$$

wherein $x$, $y$ and $z$ represent a set of molecular ratios and $x+y+z=1.00$, and wherein the compositions fall within the area A—B—C—D—E of FIG. 1 of the drawings, the sets of molecular ratios of the vertices of said area being as follows:

| | x | y | z |
|---|---|---|---|
| A | 0.01 | 0.59 | 0.40 |
| B | 0.01 | 0.09 | 0.90 |
| C | 0.05 | 0.05 | 0.90 |
| D | 0.20 | 0.20 | 0.60 |
| E | 0.20 | 0.40 | 0.40 |

2. The piezoelectric ceramic of claim 1, wherein up to 25 atom percent of Pb is replaced by at least one element selected from the group consisting of Ba, Sr and Ca.

References Cited

UNITED STATES PATENTS

| | | | |
|---|---|---|---|
| 3,372,121 | 3/1968 | Banno | 252—62.9 |
| 3,403,103 | 9/1968 | Ouchi et al. | 252—62.9 |
| 3,463,732 | 8/1969 | Banno et al. | 252—62.9 |

TOBIAS E. LEVOW, Primary Examiner

J. COOPER, Assistant Examiner

U.S. Cl. X.R.

106—39